United States Patent
Hohlfeld

(10) Patent No.: US 9,627,356 B2
(45) Date of Patent: Apr. 18, 2017

(54) SEMICONDUCTOR MODULE, SEMICONDUCTOR MODULE ARRANGEMENT AND METHOD FOR OPERATING A SEMICONDUCTOR MODULE

(71) Applicant: Infineon Technologies AG, Neubiberg (DE)

(72) Inventor: Olaf Hohlfeld, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/177,908

(22) Filed: Jun. 9, 2016

(65) Prior Publication Data

US 2016/0365333 A1 Dec. 15, 2016

(30) Foreign Application Priority Data

Jun. 10, 2015 (DE) .................. 10 2015 210 587

(51) Int. Cl.
| | |
|---|---|
| H01L 23/495 | (2006.01) |
| H01L 25/065 | (2006.01) |
| H01L 23/498 | (2006.01) |
| H01L 23/373 | (2006.01) |
| H01L 23/367 | (2006.01) |

(52) U.S. Cl.
CPC ...... *H01L 25/0655* (2013.01); *H01L 23/3672* (2013.01); *H01L 23/3731* (2013.01); *H01L 23/3737* (2013.01); *H01L 23/49822* (2013.01)

(58) Field of Classification Search
CPC ........... H01L 25/0655; H01L 23/49822; H01L 23/3737; H01L 23/3731; H01L 23/3672
USPC ...................................................... 257/668
See application file for complete search history.

(56) References Cited

U.S. PATENT DOCUMENTS

| | | | |
|---|---|---|---|
| 2008/0042164 A1* | 2/2008 | Kanschat | H01L 24/06 257/133 |
| 2013/0062750 A1* | 3/2013 | Lenniger | H01L 23/473 257/691 |
| 2013/0134572 A1* | 5/2013 | Lenniger | H01L 23/367 257/690 |

FOREIGN PATENT DOCUMENTS

| | | |
|---|---|---|
| DE | 102012213407 A1 | 2/2013 |
| DE | 102013210146 A1 | 12/2014 |

* cited by examiner

*Primary Examiner* — David S Blum
(74) *Attorney, Agent, or Firm* — Murphy, Bilak & Homiller, PLLC

(57) ABSTRACT

A semiconductor module includes a first semiconductor switch, a second semiconductor switch, a circuit carrier arrangement and a non-ceramic dielectric isolation layer. The first semiconductor switch and the second semiconductor switch have a first load terminal and a second load termina. The current path of the first semiconductor switch and the current path of the second semiconductor switch are electrically connected in series between a first circuit node and a second circuit node. A circuit carrier arrangement includes a dielectric first isolation carrier section, a dielectric second isolation carrier section, a first upper metallization layer, a second upper metallization layer and a third upper metallization layer, a first lower metallization layer, and a second lower metallization layer. The non-ceramic dielectric isolation layer is applied to the first lower metallization layer and the second lower metallization layer, and its underside forms a heat dissipating contact area of the semiconductor module.

16 Claims, 4 Drawing Sheets

SEMICONDUCTOR MODULE, SEMICONDUCTOR MODULE ARRANGEMENT AND METHOD FOR OPERATING A SEMICONDUCTOR MODULE

PRIORITY CLAIM

This application claims priority to German Patent Application No. 10 2015 210 587.3 filed on 10 Jun. 2015, the content of said application incorporated herein by reference in its entirety.

BACKGROUND

In a semiconductor module comprising at least two controllable semiconductor switches which are electrically connected in series to form a half-bridge, the series connection between the current paths has a circuit node which is usually at the electrical potential of the output. The power semiconductor chip connected to a positive supply potential of the half-bridge is then often referred to as "high-side chip," and the power semiconductor chip connected to a negative supply potential of the half-bridge is correspondingly designated as a "low-side chip." If, in a first switching state, the high-side chip is in the on state and the low-side chip is in the off state, the circuit node is substantially at the positive supply potential. If, conversely, in a second switching state, the high-side chip is in the off state and the low-side chip is in the on state, the circuit node is substantially at the negative supply potential. Consequently, either a positive or a negative supply potential can be fed to the output by means of suitable driving of the power semiconductor chips. When there is a change from the first to the second switching state or from the second to the first switching state, in the system comprising the half-bridge and an intermediate circuit capacitor connected to the half-bridge, including the associated connection lines, depending on the symmetry of the system, unavoidable common- and differential-mode currents occur which can mutually influence one another and as a consequence entail the transmission of interference emissions. As is known from DE 10 2013 210 146 A1, such interference emissions can be reduced by choosing the unavoidable capacitances between the positive supply potential and ground, on the one hand, and the negative supply potential and ground, on the other hand to be as far as possible identical.

If the semiconductor module is intended to be cooled by means of a heat sink, the heat sink is often connected to ground. In this case, it must be ensured that the heat sink is sufficiently insulated from the electrical supply potential. Ceramic substrates metalized on two sides are often used for this purpose, wherein a ceramic layer is arranged between two galvanically isolated metallization layers of the ceramic layer.

In DE 10 2013 210 146 A1, for this purpose, two respectively metallized ceramic layers are arranged between the heat sink and the semiconductor chips from which heat is to be dissipated by the heat sink. In this case, the ceramic layer closest to the heat sink has a lower metallization layer on its side facing the heat sink, said lower metallization layer determining both the capacitance between the positive supply potential and ground and the capacitance between the negative supply potential and ground.

Since two ceramic layers are arranged between each semiconductor chip and the lower metallization layer and on account of the required thicknesses of said ceramic layers, such an arrangement has high heat transfer resistances between the semiconductor chips and a heat sink mounted on the semiconductor module. Moreover, such arrangements are very cost-intensive on account of the respective two ceramic layers on account of the use of material associated therewith and the manufacturing outlay associated therewith.

SUMMARY

An object of the invention, according to embodiments, is to provide a semiconductor module and a semiconductor module arrangement which transmit few interference emissions during operation, and also a method for operating such a semiconductor module. This object is achieved by means of a semiconductor module as claimed in patent claim 1, by means of a semiconductor module arrangement as claimed in patent claim 15, and by means of a method for operating a semiconductor module as claimed in patent claim 16. Dependent claims relate to configurations and developments of the invention.

A first embodiment relates to a semiconductor module. The latter includes a first semiconductor switch, a second semiconductor switch, a circuit carrier arrangement and a non-ceramic dielectric isolation layer. Each of the first semiconductor switch and the second semiconductor switch has a first load terminal and a second load terminal, between which a current path is formed. The current path of the first semiconductor switch and the current path of the second semiconductor switch are electrically connected in series between a first circuit node and a second circuit node. The circuit carrier arrangement includes: a dielectric first isolation carrier section having a first top side and a first underside opposite the latter, a dielectric second isolation carrier section having a second top side and a second underside opposite the latter, a first upper metallization layer, which is applied to the first top side, a second upper metallization layer and a third upper metallization layer, which are applied to the second top side, a first lower metallization layer, which is applied to the first underside, and a second lower metallization layer, which is applied to the second underside. The non-ceramic dielectric isolation layer is applied to the first lower metallization layer and the second lower metallization layer, and its underside facing away from the first lower metallization layer and the second lower metallization layer forms a heat dissipating contact area of the semiconductor module.

A second embodiment relates to a semiconductor module arrangement includes a semiconductor module embodied in accordance with the first aspect, and also a heat sink, which is releasably or firmly bonded to the underside of the dielectric isolation layer of the semiconductor module.

A third embodiment relates to a method for operating a semiconductor module. For this purpose, a semiconductor module embodied in accordance with the first embodiment is provided. The first circuit node is connected to a first supply potential, and the second circuit node is connected to a second supply potential different than the first supply potential.

BRIEF DESCRIPTION OF THE DRAWINGS

The invention is explained below on the basis of exemplary embodiments with reference to the accompanying figures. In the figures, identical reference signs designate identical elements. In the figures.

In order to clarify the respective construction, the arrangements shown in the figures are not illustrated to scale.

DETAILED DESCRIPTION

Figure 1:
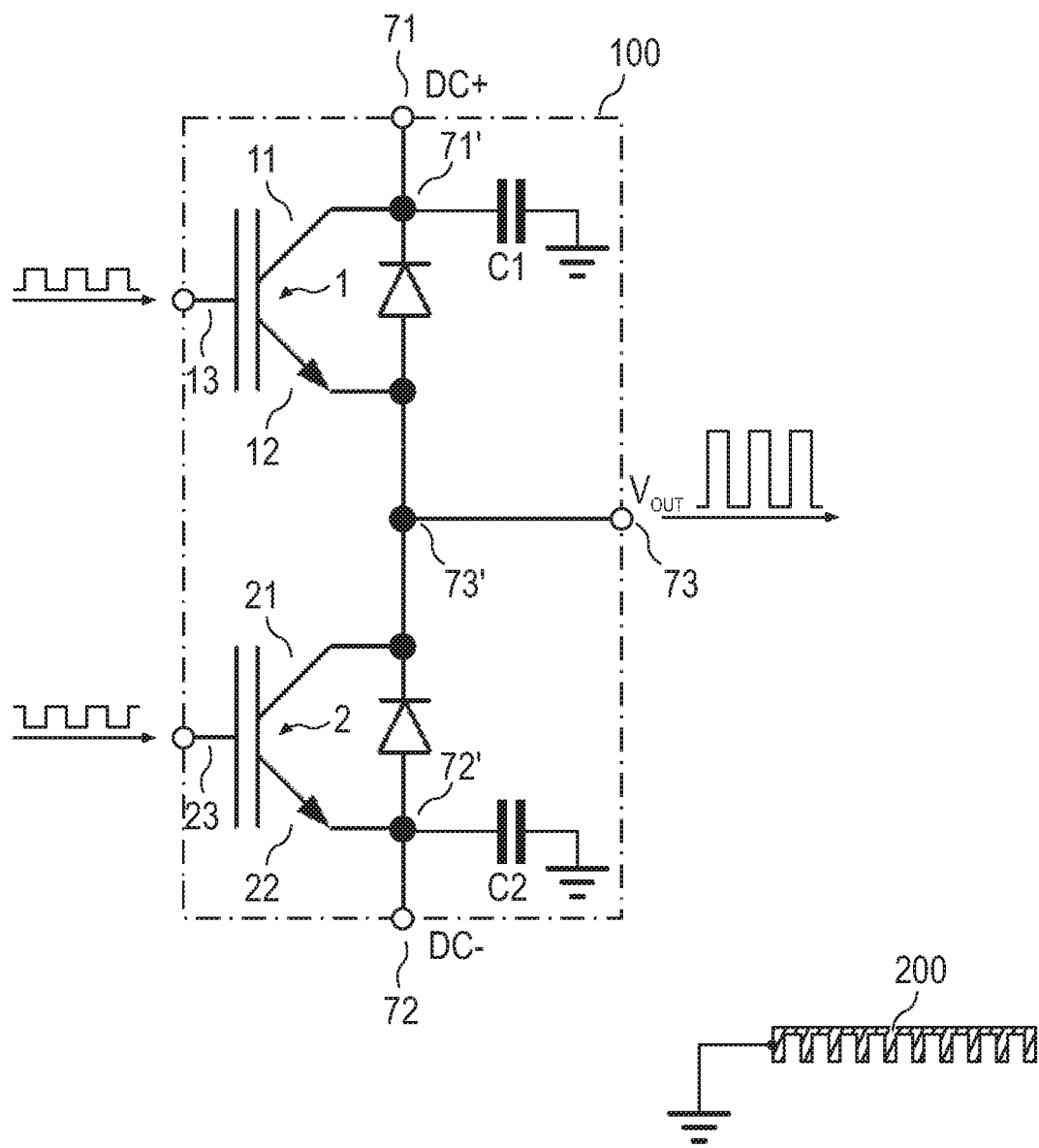
FIG. 1 shows a circuit diagram of a semiconductor module arrangement comprising a semiconductor module and a heat sink, according to an embodiment.

FIG. 1 shows a circuit diagram of a semiconductor module arrangement comprising a semiconductor module 100 and a metallic heat sink 200. It shows a first semiconductor switch 1 and a second semiconductor switch 2, which merely by way of example are embodied in each case as an n-channel IGBT. In principle, the first semiconductor switch 1 and the second semiconductor switch 2, independently of one another and in various combinations with one another, may be embodied as p-channel components or as n-channel components, and/or as normally on or as normally off components.

In any case the first semiconductor switch 1 has a first load terminal 11 and a second load terminal 12, between which a first current path is formed, and the second semiconductor switch 2 has a first load terminal 21 and a second load terminal 22, between which a second current path is formed. The first current path and the second current path are electrically connected in series between a first circuit node 71' and a second circuit node 72'. For this purpose, the second load terminal 12 of the first semiconductor switch 1 is electrically connected to the first load terminal 21 of the second semiconductor switch 2.

The first circuit node 71' may be connected to a first electrical external terminal 71 of the semiconductor module 100, for example, or it may be provided by a first electrical external terminal 71 of the semiconductor module 100. Correspondingly, the second circuit node 72' may be connected to a second electrical external terminal 72 of the semiconductor module 100, for example, or it may be provided by a second electrical external terminal 72 of the semiconductor module 100. "External terminals" of the semiconductor module 100 are understood generally to be terminals at which the semiconductor module 100 can be electrically connected externally.

Suitable component types for the first semiconductor switch 1 and the second semiconductor switch 2 are, in particular, controllable semiconductor switches comprising a control terminal by means of which the current path of the relevant semiconductor switch 1, 2 can optionally be put into an on state (semiconductor switch is switched on) or into an off state (semiconductor switch is switched off) depending on an electrical drive potential applied to the control terminal. In the case of the circuit diagram shown in FIG. 1, the first semiconductor switch 1 has a control terminal 13 and the second semiconductor switch 2 has a control terminal 23.

Suitable component types for the first semiconductor switch 1 and/or the second semiconductor switch 2 are, for example, MOSFETs (Metal Oxide Semiconductor Field-Effect Transistors), IGBTs (Insulated Gate Bipolar Transistors), JFETs (Junction Field-Effect Transistors), HEMTs (High Electron Mobility Transistors), thyristors or the like.

Depending on the type of component, the first/second load terminal 11/12, 21/22 of the same semiconductor switch 1, 2 may be for example drain/source terminals or source/drain terminals or emitter/collector terminals or collector/emitter terminals or anode/cathode terminals or cathode/anode terminals, and the control terminal 13, 23 may be gate or base terminals.

The component types may be lateral or vertical components, but only lateral components in the case of HEMTs.

Each of the semiconductor switches 1, 2 may be realized by exactly one semiconductor chip, or else by two or more semiconductor chips electrically connected in parallel. By means of such a parallel connection, for example, the current-carrying capacity may be increased and/or redundancy may be provided for the case where the functionality and/or the required current-carrying capacity of the semiconductor switch 1, 2 are/is maintained even in the event of failure of one or more semiconductor chips of the parallel connection.

In the circuit diagram in accordance with FIG. 1, a respective optional freewheeling diode is also connected in antiparallel with the current path of each of the semiconductor switches 1, 2. The freewheeling diodes (or at least two freewheeling diodes electrically connected in parallel in the same sense) may be integrated in the same semiconductor chip(s) as is the associated semiconductor switch 1 and/or 2, or they may be present as independent semiconductor chips. In principle, it is also possible to arrange the freewheeling diodes outside the semiconductor module 100.

The series connection of the current paths of the first and second semiconductor switches 1, 2 between the first circuit node 71' and the second circuit node 72' gives rise to a half-bridge having a third circuit node 73' situated electrically between the current paths of the first and second semiconductor switches 1, 2. In the case of the example in accordance with FIG. 1, the third circuit node 73' is electrically connected to an external terminal 73 of the semiconductor module 100.

In order to supply the half-bridge with an electrical voltage, a first electrical supply potential DC+ is fed to the first circuit node 71' (for example via the external terminal 71), and a second electrical supply potential DC− different than the first supply potential DC+ is fed to the second circuit node 72' (for example via the external terminal 72). The first supply potential DC+ may be greater than the second supply potential DC−, for example. By way of example, the difference between the first supply potential DC+ and the second supply potential DC− may be at least 10 V, at least 100 V or even at least 1000 V. The voltage present between the first circuit node 71' and the second circuit node 72', that is to say the potential difference between DC+ and DC−, may be in particular a DC voltage, or at least a voltage having a significant DC voltage proportion.

If, in a first switching state of the half-bridge, the first semiconductor switch 1 is switched on by a suitable electrical drive potential being applied to the first control terminal 13 (i.e., the current path of the first semiconductor switch 1 is in the on state) and the second semiconductor switch 2 is switched off by a suitable electrical drive potential being applied to the second control terminal 23 (i.e., the current path of the second semiconductor switch 2 is in the off state), the third circuit node 73' (and thus in the present example also the external terminal 73) is at the first supply potential DC+ (apart from small voltage drops across the first current path and across the low-resistance electrical connection lines).

If, furthermore, in a second switching state of the half-bridge, the first semiconductor switch 1 is switched off by a suitable electrical drive potential being applied to the first control terminal 13 (i.e., the current path of the first semiconductor switch 1 is in the off state) and the second semiconductor switch 2 is switched on by a suitable electrical drive potential being applied to the second control terminal 23 (i.e., the current path of the second semiconductor switch 2 is in the on state), the third circuit node 73' (and thus in the present example also the external terminal 73) is at the second supply potential DC− (apart from small voltage drops across the first current path and across the low-resistance electrical connection lines).

Consequently, by switching over between the first switching state and the second switching state, the electrical (output) potential $V_{OUT}$ at the third circuit node 73' (and thus in the present example also the electrical potential at the external terminal 73) (apart from the small voltage drops mentioned) can be switched over between the first supply potential DC+ and the second supply potential DC−. In particular, the output potential $V_{OUT}$ can be formed as an alternating potential by high-frequency and repeated switching over between the first and second switching states.

Furthermore, FIG. 1 also illustrates unavoidable capacitances C1 and C2 which occur during the operation of the semiconductor module 100 or the semiconductor module arrangement between the first circuit node 71' and ground and respectively between the second circuit node 72' and ground. By way of example, a metallic heat sink 200 that is thermally coupled to the semiconductor module 100 may be at ground potential. The unavoidable capacitances C1, C2 are caused, inter alia, by conductor tracks and conductor surfaces.

An interconnection of a semiconductor module 100 or a semiconductor module arrangement comprising a semiconductor module 100 and a heat sink, such as was explained above with reference to FIG. 1, may apply to any semiconductor module 100 according to the invention or to any semiconductor module arrangement according to the invention comprising a semiconductor module 100 and a heat sink, in particular to the semiconductor modules or semiconductor module arrangements explained on the basis of the following exemplary embodiments.

Figure 2:
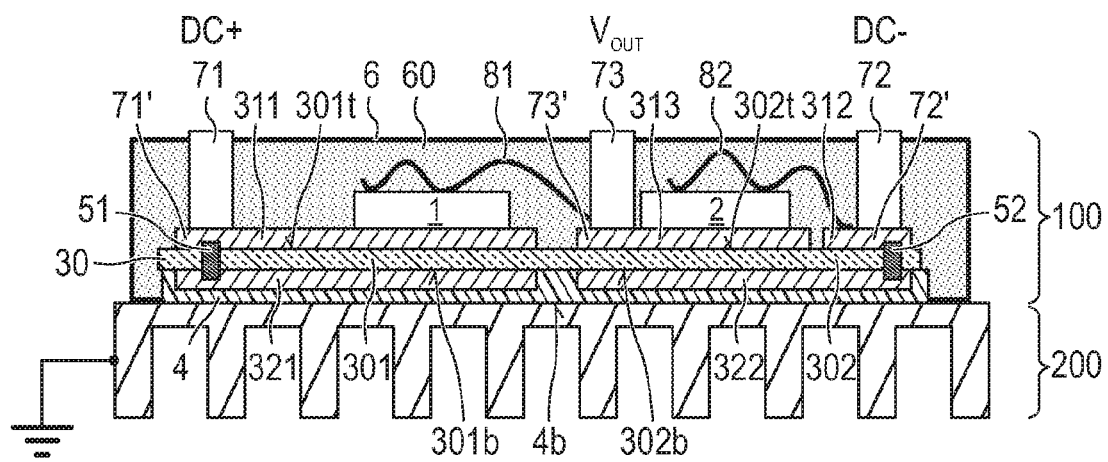
FIG. 2 shows a vertical sectional view through a semiconductor module arrangement in accordance with a first example.

FIG. 2 shows a vertical sectional view through a semiconductor module arrangement comprising a semiconductor module 100 and a heat sink 200. The semiconductor module 100 comprises a first semiconductor switch 1 and a second semiconductor switch 2. Each of the first semiconductor switch 1 and the second semiconductor switch 2 may be realized, as explained, by exactly one or by at least two parallel-connected semiconductor chips. Each of the first semiconductor switch 1 and the second semiconductor switch 2 comprises a first load terminal 11, 21 and a second load terminal 12, 22.

The semiconductor switches 1, 2 are arranged on a circuit carrier arrangement. The latter comprises a dielectric first isolation carrier section 301 having a first top side 301t and a first underside 301b opposite the latter, a dielectric second isolation carrier section 302 having a second top side 302t and a second underside 302b opposite the latter, a first upper metallization layer 311, which is applied to the first top side 301t, a second upper metallization layer 312, which is applied to the second top side 302t, a third upper metallization layer 313, which is likewise applied to the second top side 302t, a first lower metallization layer 321, which is applied to the first underside 301b, and a second lower metallization layer 322, which is applied to the second underside 302b.

In the example shown, the dielectric first isolation carrier section 301 and the dielectric second isolation carrier section 302 are sections of an electrically insulating isolation carrier 30 that are spaced apart from one another. The isolation carrier 30 and thus also the sections 301, 302 consist of an electrically insulating material. By way of example, electrically insulating ceramics, e.g., aluminum oxide (Al2O3), aluminum nitride (AlN), beryllium oxide (BeO), zirconium oxide (ZrO2), silicon nitride (Si3N4), but also other ceramics, are well suited.

The first upper metallization layer 311, the second upper metallization layer 312, the third upper metallization layer 313, the first lower metallization layer 321 and the second lower metallization layer 322 consist of materials having good electrical conductivity, for example copper or a copper alloy or aluminum or an aluminum alloy.

The first upper metallization layer 311 and the first lower metallization layer 321 are arranged on mutually opposite sides of the first isolation carrier section 301 and are directly and firmly bonded thereto. Correspondingly, the second upper metallization layer 312 and the third upper metallization layer 313, on the one hand, and the second lower metallization layer 322, on the other hand, are arranged on mutually opposite sides of the second isolation carrier section 302 and are directly and firmly bonded thereto.

The circuit carrier arrangement may be embodied as a DCB substrate, for example, in which the isolation carrier 30 is embodied as an aluminum oxide ceramic lamina, and in which the first upper metallization layer 311, the first lower metallization layer 321, the second upper metallization layer 312, the second lower metallization layer 322 and also the third upper metallization layer 313 are embodied in each case as copper foils which were connected to the isolation carrier 30 in a planar manner by means of the known DCB method (DCB=Direct Copper Bonding).

The first upper metallization layer 311 and the first lower metallization layer 321 are electrically conductively connected to one another by at least one electrically conductive connection element 51. The second upper metallization layer 312 and the second lower metallization layer 322 are electrically conductively connected to one another by at least one electrically conductive connection element 52. The electrically conductive connection element 51 may be embodied for example as a plated-through hole in the first isolation carrier section 301. Independently thereof, the electrically conductive connection element 52 may be embodied for example as a plated-through hole in the second isolation carrier section 302.

In order to prevent the first lower metallization layer 321 and the second lower metallization layer 322 from electrically contacting the heat sink 200, a non-ceramic dielectric isolation layer 4 is provided, which is applied to the first lower metallization layer 321 and to the second lower metallization layer 322 and is firmly bonded to them, and which covers and thus electrically insulates both that side of the first lower metallization layer 321 which faces away from the first isolation carrier section 301 and that side of the second lower metallization layer 322 which faces away from the second isolation carrier section 302. In order to achieve a good electrical insulation between the lower metallization layers 321, 322 on the one hand, and the heat sink 200, on the other hand, the isolation layer 4 at a temperature of 20° C. may have a resistivity of more than 10 GΩ·cm (1E10 ohm·cm) and/or a breakdown strength of more than 10 kV/mm.

The dielectric isolation layer 4 has an underside 4b facing away from the first lower metallization layer 321 and the second lower metallization layer 322, said underside forming a heat dissipating contact area of the semiconductor module 100. The heat sink 200 is in thermal contact with the underside 4b, such that the waste heat arising in the semiconductor switches 1, 2 during the operation of the semiconductor module 100 can be dissipated to the heat sink 200 via the upper metallization layers 311, 312, 313, the isolation carrier sections 301, 302, the lower metallization layers 321, 322 and the isolation layer 4 through the underside 4b. With the heat sink 200 not mounted on the semiconductor module 100, the underside 4b forms an outer surface of the semiconductor module 100.

The internal electrical interconnection of the semiconductor module 100 may be effected with the aid of arbitrary electrically conductive connection elements 81, 82 such as, for example, bonding wires, bonding ribbons, metal strips, etc.

The external terminal 71 is permanently electrically conductively connected to the first upper metallization layer 311 and thus—on account of the electrically conductive connection element 51—also to the first lower metallization layer 321, and the external terminal 72 is permanently electrically conductively connected to the second upper metallization layer 312 and thus—on account of the electrically conductive connection element 52—also to the second lower metallization layer 322. Moreover, the external terminal 73 is permanently electrically conductively connected to the third upper metallization layer 313. In this context, "permanently electrically conductively connected" means that the elements which are electrically conductively connected to one another are electrically conductively connected to one another in a manner uninterrupted over time.

In the example shown, the first semiconductor switch 1 is arranged on the first upper metallization layer 311, and the second semiconductor switch 2 is arranged on the third upper metallization layer 313. However, this is merely one example. Equally, for example, the second semiconductor switch 2 could also be arranged on the second upper metallization layer 312. Generally, both the first semiconductor switch 1 and the second semiconductor switch 2 can be arranged on the totality of the (if appropriate also more than only three) upper metallization layers 311, 312, 313, as long as a half-bridge can thus be realized, as was explained with reference to FIG. 1.

As can be discerned with reference to FIG. 2, a semiconductor module 100 may comprise at least three upper metallization layers 311, 312, 313 spaced apart from one another. One of said upper metallization layers 311, 312, 313 (here the first upper metallization layer 311) has the electrical potential of the first circuit node 71' (here: the first electrical potential DC+), another of said upper metallization layers 311, 312, 313 (here the second upper metallization layer 312) has the electrical potential of the second circuit node 72' (here: the second electrical potential DC−), and yet another of said upper metallization layers 311, 312, 313 (here the third upper metallization layer 313) has the electrical potential of the third circuit node 73' (here: the electrical output potential $V_{OUT}$).

The area requirement for the upper metallization layers 311, 312, 313 of the circuit carrier arrangement is essentially determined by the area required for mounting the semiconductor switches 1 and 2. In principle, it is advantageous if the circuit carrier arrangement has the smallest possible structural size and, in association therewith, if the total basic area of the upper metallization layers 311, 312, 313 is as small as possible. For various other reasons it may furthermore be desirable to mount one of the first or the second semiconductor switch 1, 2 on that one (if appropriate also those) or the upper metallization layers 311, 312, 313 which has the output potential $V_{OUT}$ of the half-bridge (here: on the third upper metallization layer 313), and the other semiconductor switch on one (if appropriate also a plurality) of the upper metallization layers 311, 312 which have one of the supply potentials (i.e., one of the first supply potential DC+ or the second supply potential DC−) (here: on the first upper metallization layer 311 having the first supply potential DC+), while the remaining one of the upper metallization layers 311, 312, 313 (here: the second upper metallization layer 312), which has the other of the supply potentials DC+, DC− (here: the negative supply potential DC−), may be equipped neither with the first nor with the second semiconductor switch 1, 2.

As a result, the stated boundary conditions may have the effect that, of the first upper metallization layer 311 having the electrical potential of the first circuit node 71' and the second upper metallization layer 312 having the electrical potential of the second circuit node 72', one is equipped with the first semiconductor switch 1 or with the second semiconductor switch 2, while the other is equipped neither with the first semiconductor switch nor with the second semiconductor switch 2. On account of that, the total basic surface area of that one (those) of the first upper metallization layer(s) 311 which has/have the first supply potential (here: DC+), i.e., the electrical potential of the first circuit node 71', may differ significantly from the total basic surface area of that one (those) of the second upper metallization layer(s) 312 which has/have the second supply potential (here: DC−), i.e., the electrical potential of the second circuit node 72'. That in turn has the effect that the capacitances C1 and C2 (see FIG. 1) may differ significantly, which as mentioned is not desirable.

The present invention combats this problem by a first lower metallization layer 321 being electrically conductively connected to the electrical potential of the first circuit node 71' by a first electrical connection 51, and by a second lower metallization layer 322, the basic area of which does not differ all that much from the basic area of the first lower metallization layer 321, being electrically conductively connected to the electrical potential of the second circuit node 72' by a second electrical connection 52. The capacitances C1 and C2 with respect to ground (that is to say e.g., with respect to the heat sink 200) are thus essentially determined by the basic areas of the two lower metallization layers 321 and 322.

While the circuit carrier arrangements in conventional semiconductor modules in each case comprise only one lower metallization layer that is electrically isolated from the upper metallization layer(s), a semiconductor module 100 according to the present invention comprises at least two lower metallization layers 321, 322 which are electrically isolated and between which a supply voltage given by the difference between the supply potentials DC+, DC− is present during the operation of the semiconductor module 100.

Figure 9:
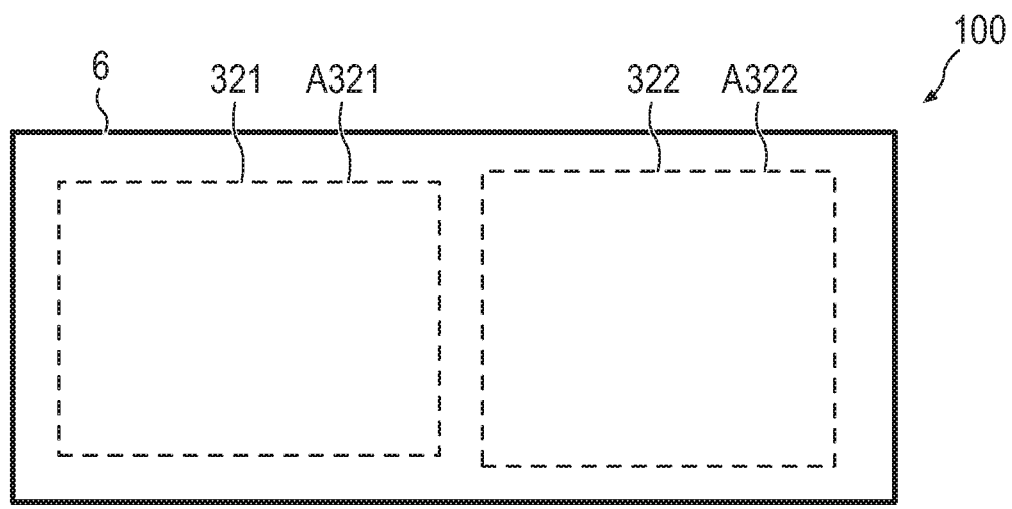
FIG. 9 shows a plan view of a semiconductor module which reveals the basic areas of the first lower metallization layer and the second lower metallization layer.

In this respect, FIG. 9 shows a schematic plan view of the semiconductor module 100 (the external terminals 71, 72, 73 are omitted for the sake of simplicity) illustrating the basic areas of the first lower metallization layer 321 and of the second lower metallization layer 322 with the aid of dashed lines. The first lower metallization layer 321 has a first basic surface area A321, and the second lower metallization layer 322 has a second basic surface area A322. Within the meaning of the present invention, the basic surface area of a metallization layer is considered to be the largest area that its orthogonal projection onto a plane can have (i.e., if the surface area of the orthogonal projection of the metallization layer onto the respective plane is determined for all conceivable planes, then the basic surface area of the metallization layer is the largest possible one of all these surface areas).

By way of example, the first basic surface area A321 of the first lower metallization layer 321 and the second basic surface area A322 of the second lower metallization layer 322 may be chosen such that the ratio A321÷A322 of the first metallization layer A321 to the second basic surface area A322 is in the range of 0.95 to 1/0.95 (approximately 1.05). In particular, the first basic surface area A321 and the second basic surface area A322 may also be chosen to be identical. The criteria mentioned apply not only to the semiconductor module 100 or the semiconductor module arrangement 100, 200 in accordance with FIG. 2, whether they may be applied to all semiconductor modules 100 and semiconductor module arrangements 100, 200 of the present invention.

In order to obtain a good thermal contact between the underside 4b of the isolation layer 4 and the heat sink 200, the heat sink 200 may directly contact the underside 4b. In this case, the heat sink 200 may contact the underside 4b directly cohesively or in a materially flush manner. Alternatively, the thermal contact between the underside 4b and the heat sink 200 may also be embodied as indirect contact, for example by virtue of the fact that a thermally conductive medium (not shown) which is embodied as a thin layer and which is introduced between the heat sink 200 and the underside 4b extends continuously from the heat sink 200 as far as the underside 4b. The thermally conductive medium may be a thermally conductive paste, for example, or a phase change medium which is solid or pasty at room temperature and the viscosity of which decreases on account of its heating caused by the operation of the semiconductor module 100.

The semiconductor module 100 furthermore comprises a housing 6. The housing 6 may be for example a plastic housing, for example a thermosetting plastic housing, a thermoplastic housing, a ceramic housing, or a metal housing. By way of example, a dielectric potting compound 60, e.g., a silicone gel, may be filled into the interior of the housing 6, said potting compound extending from the upper metallization layers 311, 312 and 313 at least across the semiconductor switches 1 and 2. In this case, the potting compound 60 may completely or only partly fill the interior of the housing 6. In such configurations, the material of the housing 6 and the material of the potting compound 60 may be different materials.

The non-ceramic dielectric isolation layer 4 may already be a constituent of the semiconductor module 100 before the heat sink 200 is mounted on the semiconductor module 100, that is to say that the underside 4b of the isolation layer 4 forms an outer surface of the semiconductor module 100 (not yet mounted on the heat sink 200). By way of example, the isolation layer 4 may be applied to the circuit carrier arrangement with the isolation carrier sections 301, 302, the upper metallization layers 311, 312, 313 and the lower metallization layers 321, 322 and then together therewith be provided with the housing 6. If a potting compound 60 is filled into the housing 6, the filling can then be carried out.

A semiconductor module 100 already having an isolation layer 4 may then be mounted on a heat sink 200 using a heat transfer medium such as e.g., a thermally conductive paste or a phase change material (not illustrated in the figures) which is introduced between the underside 4b and the heat sink 200 and which extends continuously from the underside 4b to the heat sink 200. Since a thermally conductive paste or a phase change medium can easily be removed again, the connection between the semiconductor module 100 and the heat sink 200 may be formed as a releasable, materially flush but not cohesive connection. By way of example, a filled or unfilled polymer (e.g., a polyimide or an epoxy resin) may be used as material for the isolation layer 4.

Alternatively, a semiconductor module 100 already having an isolation layer 4 may also be mounted on a heat sink 200 such that a cohesive connection arises between the isolation layer 4 and the heat sink 200, for example by the isolation layer 4 that already forms a constituent of the semiconductor module 100 being pressed directly onto the sufficiently heated heat sink 200, such that the isolation layer 4 incipiently melts at least at its underside 4b in contact with the heat sink 200, and that, with the press-on pressure being maintained, it cools again until it solidifies and combines cohesively with the heat sink 200. Here, too, by way of example, a filled or unfilled polymer (e.g., a polyimide or an epoxy resin) is suitable as material for the isolation layer 4.

Likewise, a prefabricated plastic layer (e.g., a polyimide or epoxy resin layer) may be used as the isolation layer 4, said plastic layer being adhesively bonded both to the heat sink 200 and to the first and second lower metallization layers 321, 322.

The distances between the underside 4b and the first lower metallization layer 321 and between the underside 4b and the second lower metallization layer 322 may be for example greater than or equal to 20 μm and/or less than or equal to 200 μm. In principle, however, larger or smaller values are also possible.

Figure 3:
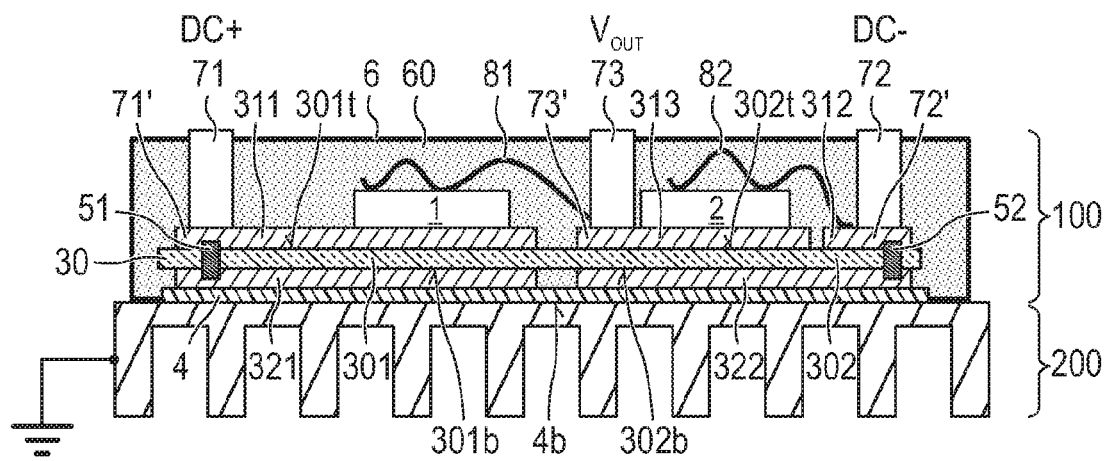
FIG. 3 shows a vertical sectional view through a semiconductor module arrangement in accordance with a second example.

As is further illustrated in FIG. 2, the isolation layer 4 may also cover the narrow sides of the first and second lower metallization layers 321, 322 and extend as far as the first and second isolation carrier sections 301, 302. As is furthermore illustrated in FIG. 3, the isolation layer 4 may alternatively also be embodied as a planar layer. For the rest, the semiconductor modules 100 or the semiconductor module arrangements 100, 200 in FIGS. 2 and 3 are identical.

Figure 5:
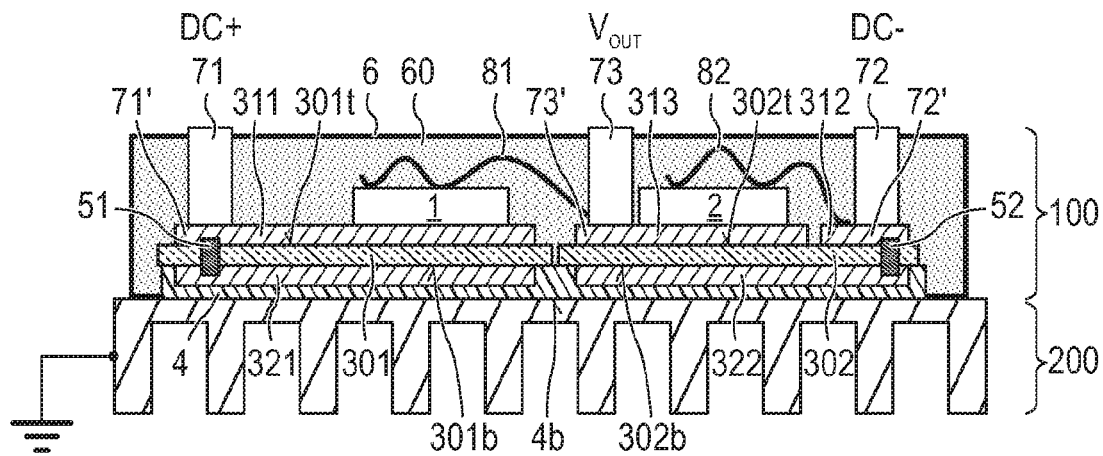
FIG. 5 shows a vertical sectional view through a semiconductor module arrangement in accordance with a fourth example.

FIG. 5 shows another vertical section through a configuration in which the housing 6 is produced by the circuit carrier arrangement equipped with the semiconductor switches 1, 2 being encapsulated with a molding compound by injection molding. In this case the molding compound also forms the isolation layer 4.

The encapsulation by injection molding can be carried out such that the circuit carrier arrangement equipped with the semiconductor switches 1, 2 is arranged in an injection mold and encapsulated with the molding compound by injection molding, such that firstly a semiconductor module 100 with the injection-molded isolation layer 4 arises. The semiconductor module 100 having the isolation layer 4 and prefabricated in this way may then be mounted on a heat sink 200 by one of the methods already explained.

Alternatively, the encapsulation by injection molding may also be carried out such that the circuit carrier arrangement equipped with the semiconductor switches 1, 2 is arranged adjacent to the heat sink 200 in such a way that a respective gap remains between the first and second lower metallization layers 321, 322 and the heat sink 200. During the subsequent encapsulation of the equipped circuit carrier arrangement by injection molding, not only is the housing 6 produced, but the gaps are also filled with molding compound. The gap widths and thus the distances between the underside 4b and the first lower metallization layer 321 and between the underside 4b and the second lower metallization layer 322 may be for example greater than or equal to 100 μm and/or less than or equal to 500 μm. In principle, however, larger or smaller values are also possible. In this variant of encapsulation by injection molding, the molding compound forming the isolation layer 4 may bond adhesively not only to the circuit carrier arrangement but also to the heat sink 200, such that a cohesive connection arises between the underside 4b of the isolation layer 4 and the heat sink 200. Accordingly, the semiconductor module 100 is then also firmly bonded to the heat sink 200.

Figure 4:
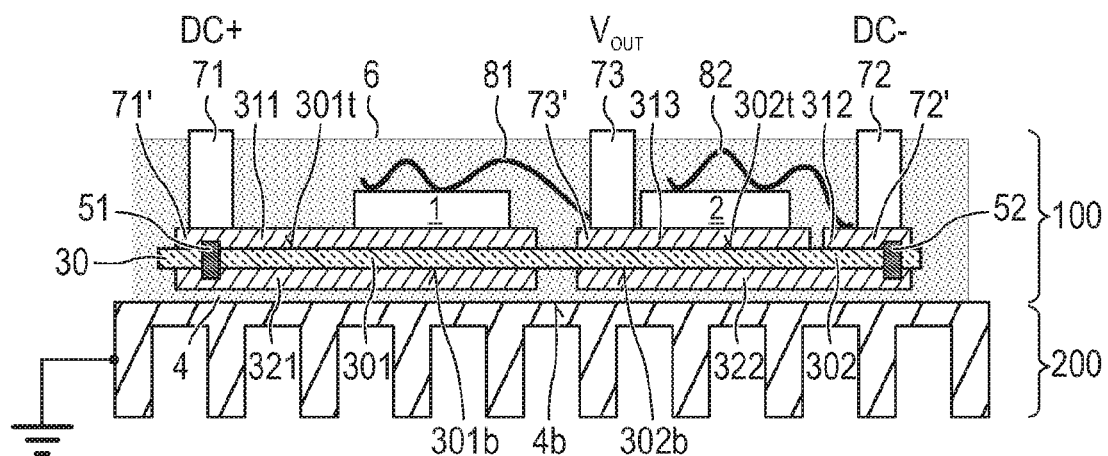
FIG. 4 shows a vertical sectional view through a semiconductor module arrangement in accordance with a third example.

In the examples shown in FIGS. 2, 3 and 4, the dielectric first isolation carrier section 301 and the dielectric second isolation carrier section 302 are sections of an electrically insulating (for example ceramic) isolation carrier 30 that are spaced apart from one another.

Figure 6:
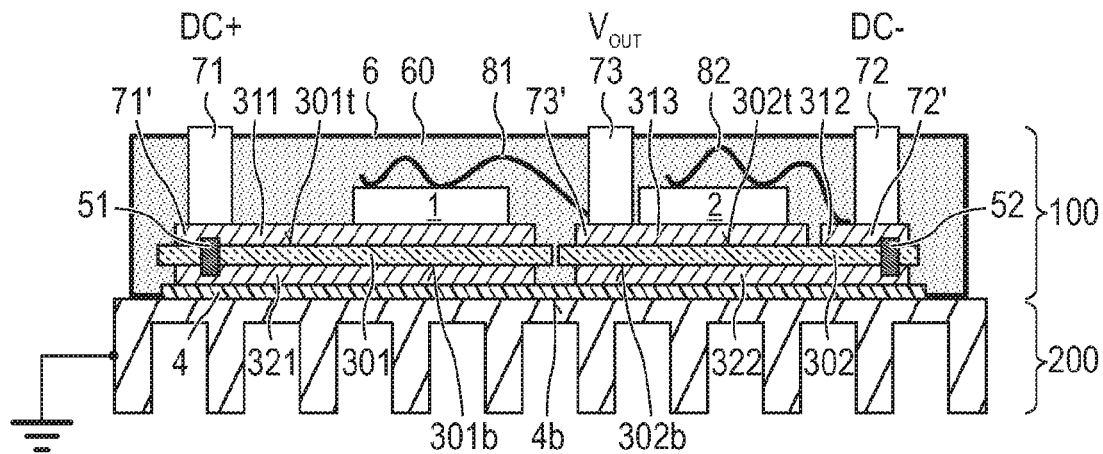
FIG. 6 shows a vertical sectional view through a semiconductor module arrangement in accordance with a fifth example.
Figure 7:
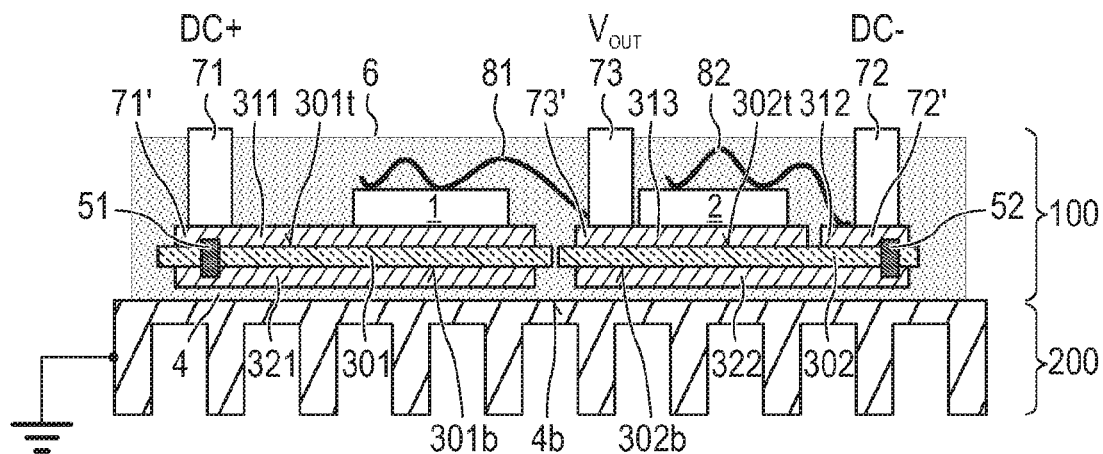
FIG. 7 shows a vertical sectional view through a semiconductor module arrangement in accordance with a sixth example.

In the case of the arrangements in accordance with FIGS. 5, 6 and 7, by contrast, the dielectric first isolation carrier section 301 and the dielectric second isolation carrier section 302 in each case constitute a dedicated electrically insulating (for example ceramic) isolation carrier. For the rest, the arrangements in accordance with FIGS. 5, 6 and 7 correspond to the arrangements in accordance with FIGS. 2, 3 and 4, respectively. The arrangements in accordance with FIGS. 5, 6 and 7 may be produced in the same way as was explained with reference to the corresponding arrangements in accordance with FIGS. 2, 3 and 4, respectively.

Figure 8:
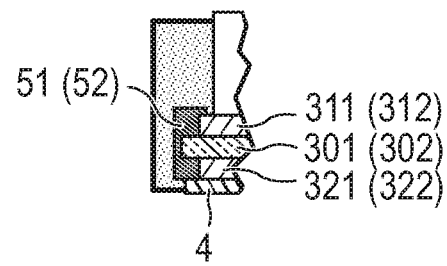
FIG. 8 shows a vertical sectional view through a portion of a semiconductor module wherein an electrical connection between an upper metallization of an isolating carrier and a lower metallization of the isolating carrier extends around the lateral edge of the isolating carrier.

In the case of the configurations shown with reference to FIGS. 2 to 7, the electrically conductive connection elements 51 and 52 are embodied as plated-through holes in the first isolation carrier section 301 and in the second isolation carrier section 302, respectively. As is illustrated in FIG. 8, a first electrical connection 51 may also be embodied such that it extends around a lateral edge of the first isolation carrier section 301 and permanently electrically conductively connects the first upper metallization layer 311 to the first lower metallization layer 321. Alternatively or additionally, a second electrical connection 52 may also be embodied such that it extends around a lateral edge of the second isolation carrier section 302 and permanently electrically conductively connects the second upper metallization layer 312 to the second lower metallization layer 322.

The present invention makes it possible to achieve a good thermal coupling between a semiconductor module 100 and a heat sink 200, without two or more ceramic layers being arranged between the first semiconductor switch 1 and the underside 4b of the isolation layer 4, and without two or more ceramic layers being arranged between the second semiconductor switch 2 and the underside 4b of the isolation layer 4.

To put it another way, no or exactly one (the first isolation carrier section 301) ceramic layer may be arranged between the first semiconductor switch 1 and the underside 4b of the isolation layer 4, and none or exactly one (the second isolation carrier section 302) ceramic layer may be arranged between the second semiconductor switch 2 and the underside 4b of the isolation layer 4.

The thickness of the isolation layer 4 may be chosen to be very small so as to permit a good dissipation of heat from the semiconductor switches 1, 2 toward the underside 4b or toward the heat sink 200. By way of example, the distance between the first lower metallization layer 321 and the underside 4b and/or the distance between the second lower metallization layer 322 may be at least 20 μm or at least 100 μm. Alternatively or additionally, the distance between the first lower metallization layer 321 and the underside 4b and/or the distance between the second lower metallization layer 322 may be less than or equal to 500 μm or less than or equal to 200 μm.

In all configurations of the invention, the isolation layer 4 may be embodied or the semiconductor module 100 or the semiconductor module arrangement 100, 200 may be operated such that the isolation layer 4 does not soften or even melt. By way of example, it may be embodied such that at temperatures of less than or equal to 80° C. is always has a Shore A hardness (measured according to DIN ISO 7619-1) of at least 20 or even of at least 50.

The invention claimed is:

1. A semiconductor module comprising:
   a first semiconductor switch and a second semiconductor switch, each of which comprises a first load terminal and a second load terminal, between which a current path is formed, wherein the current path of the first semiconductor switch and the current path of the second semiconductor switch are electrically connected in series between a first circuit node and a second circuit node;
   a circuit carrier arrangement comprising:
      a dielectric first isolation carrier section having a first top side and a first underside opposite the latter;
      a dielectric second isolation carrier section having a second top side and a second underside opposite the latter;
      a first upper metallization layer, which is applied to the first top side;
      a second upper metallization layer and a third upper metallization layer, which are applied to the second top side;
      a first lower metallization layer, which is applied to the first underside;
      a second lower metallization layer, which is applied to the second underside; and
   a non-ceramic dielectric isolation layer, which is applied to the first lower metallization layer and to the second lower metallization layer and which has an underside facing away from the first lower metallization layer and the second lower metallization layer, said underside forming a heat dissipating contact area of the semiconductor module.

2. The semiconductor module as claimed in claim 1, wherein the first load terminal of the first semiconductor switch is permanently electrically conductively connected to the first upper metallization layer; and the second load terminal of the second semiconductor switch is permanently electrically conductively connected to the second upper metallization layer.

3. The semiconductor module as claimed in claim 1, wherein the first upper metallization layer and the first lower metallization layer are permanently electrically conductively connected by means of a first electrically conductive connection, which is embodied as a via in the first isolation carrier section or which extends around a lateral edge of the first isolation carrier section; and the second upper metallization layer and the second lower metallization layer are permanently electrically conductively connected by means of a second electrically conductive connection, which is embodied as a via in the second isolation carrier section or which extends around a lateral edge of the second isolation carrier section.

4. The semiconductor module as claimed in claim 1, wherein the first lower metallization layer has a first basic surface area;

the second lower metallization layer has a second basic surface area; and wherein the ratio between the first basic surface area and the second basic surface area is in the range of 0.95 to 1/0.95.

5. The semiconductor module as claimed in claim 4, wherein the first basic surface area is equal to the second basic surface area.

6. The semiconductor module as claimed in claim 1, wherein the first isolation carrier section and the second isolation carrier section consist of ceramic.

7. The semiconductor module as claimed in claim 1, wherein the first isolation carrier section and the second isolation carrier section are sections of a continuous ceramic isolation carrier.

8. The semiconductor module as claimed in claim 1, wherein the first isolation carrier section and the second isolation carrier section are embodied as separate ceramic isolation carriers spaced apart from one another.

9. The semiconductor module as claimed in claim 1, wherein no or only exactly one ceramic layer is arranged between the first semiconductor switch and the underside of the non-ceramic dielectric isolation layer; and/or no or only exactly one ceramic layer is arranged between the second semiconductor switch and the underside of the non-ceramic dielectric isolation layer.

10. The semiconductor module as claimed in claim 1, wherein the dielectric isolation layer is embodied as a polymer layer.

11. The semiconductor module as claimed in claim 1, wherein the distance between the underside of the dielectric isolation layer and the first lower metallization layer is at least 20 μm or at least 100 μm; and/or the distance between the underside of the dielectric isolation layer and the second lower metallization layer is at least 20 μm or at least 100 μm.

12. The semiconductor module as claimed in claim 1, wherein the distance between the underside of the dielectric isolation layer and the first lower metallization layer is less than or equal to 500 μm or less than or equal to 200 μm; and/or the distance between the underside of the dielectric isolation layer and the second lower metallization layer is less than or equal to 500 μm or less than or equal to 200 μm.

13. The semiconductor module as claimed in claim 1, wherein the dielectric isolation layer at temperatures of less than or equal to 80° C. always has a Shore A hardness according to DIN ISO 7619-1 of at least 20.

14. The semiconductor module as claimed in claim 1, wherein the underside of the dielectric isolation layer is freely accessible.

15. A semiconductor module arrangement comprising:
a semiconductor module embodied as claimed in any of the preceding claims; and
a heat sink, which is releasably or firmly bonded to the underside of the dielectric isolation layer.

16. A method for operating a semiconductor module, wherein the method comprises:
providing a semiconductor module embodied as claimed in claim 1;
connecting the first circuit node to a first supply potential; and
connecting the second circuit node to a second supply potential different than the first supply potential.

* * * * *

UNITED STATES PATENT AND TRADEMARK OFFICE
CERTIFICATE OF CORRECTION

PATENT NO. : 9,627,356 B2
APPLICATION NO. : 15/177908
DATED : April 18, 2017
INVENTOR(S) : O. Hohlfeld Page 1 of 1

It is certified that error appears in the above-identified patent and that said Letters Patent is hereby corrected as shown below:

On the Title Page

Abstract (Line 6), please change "termina." to -- terminal. --.

Signed and Sealed this
Fourth Day of July, 2017

Joseph Matal
*Performing the Functions and Duties of the*
*Under Secretary of Commerce for Intellectual Property and*
*Director of the United States Patent and Trademark Office*